US008786471B1

(12) United States Patent
Shirguppi

(10) Patent No.: US 8,786,471 B1
(45) Date of Patent: Jul. 22, 2014

(54) LOSSLESS DATA COMPRESSION WITH VARIABLE WIDTH CODES

(71) Applicant: Oracle International Corporation, Redwood Shores, CA (US)

(72) Inventor: Sagar Shamrao Shirguppi, Bangalore (IN)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 13/832,048

(22) Filed: Mar. 15, 2013

(51) Int. Cl.
*H03M 7/34* (2006.01)
*H03M 7/30* (2006.01)

(52) U.S. Cl.
CPC .......... *H03M 7/3084* (2013.01); *H03M 7/3086* (2013.01); *H03M 7/3088* (2013.01)
USPC .............................................. 341/51; 341/50

(58) Field of Classification Search
CPC H03M 7/3084; H03M 7/3086; H03M 7/3088
USPC .......................................... 341/50, 51, 65, 67
See application file for complete search history.

(56) References Cited

U.S. PATENT DOCUMENTS

| | | | |
|---|---|---|---|
| 5,293,379 A | | 3/1994 | Carr |
| 5,572,206 A * | | 11/1996 | Miller et al. ..................... 341/51 |
| 5,771,010 A * | | 6/1998 | Masenas ......................... 341/51 |
| 5,903,230 A * | | 5/1999 | Masenas ......................... 341/51 |
| 6,426,711 B1 | | 7/2002 | Cooper |
| 6,879,271 B2 | | 4/2005 | Abdat |
| 7,256,715 B1 | | 8/2007 | Langhammer |
| 7,453,377 B2 * | | 11/2008 | Lee et al. ........................ 341/51 |
| 7,696,906 B2 | | 4/2010 | Dey |
| RE43,558 E | | 7/2012 | Achler |

OTHER PUBLICATIONS

David Salomon, Data Compression: The Complete Reference 3rd Edition, Date Sep. 2003, pp. 205-209, ISBN 0-387-40697-2, Springer.

James D. Murray and William Vanryper , Lempel-Ziv-Welch (LZW) Compression, Encyclopedia of Graphics File Formats, Second Edition, Date Apr. 1996, pp. 1-8, ISBN: 1-56592-161-5, O'Reilly & Associates, Inc, CA 95472, United States of America.

Nan Zhang, Tao Tao, Ravi Vijaya Satya, Mukherjee A, Modified LZW algorithm for efficient compressed text retrieval, Information Technology: Coding and Computing, 2004. Proceedings. ITCC 2004. International Conference, Date of Conference: Apr. 5-7, 2004, pp. 224-228, vol. 2, ISBN: 0-7695-2108-8.

(Continued)

*Primary Examiner* — Khai M Nguyen
(74) *Attorney, Agent, or Firm* — Narendra Reddy Thappeta

(57) ABSTRACT

An aspect of the present invention provides for lossless compression of an input stream using variable width codes. In an embodiment, in each of a sequence of iterations, an output code is emitted (to an output stream) corresponding to a longest string from a present symbol based on entries in a dictionary. In each iteration, two entries are thereafter added to the dictionary, with the first entry associating (the longest string+symbol succeeding said longest string in said input stream) to a first available code in the dictionary, and a second entry associating a (previous token+symbol succeeding said previous token in said input stream) to a second available code in the dictionary, wherein the previous token represents the token of a first entry in a previous iteration, and wherein '+' represents a text appending operation.

20 Claims, 5 Drawing Sheets

(56) References Cited

OTHER PUBLICATIONS

Pawel Gawrychowski, Optimal pattern matching in LZW compressed strings, SODA '11 Proceedings of the Twenty-Second Annual ACM-SIAM Symposium on Discrete Algorithms, Date 2011, pp. 362-372, SIAM.

Amit Jain, Priyanka, Vinay Goyal, Priority based LZW algorithm, Tri-Annualy Quality Research Journal, Publication Date Aug. 20, 2011, pp. 405-407, vol. 1: Issue 1.
Gawrychowski, Pawel, Simple and efficient LZW-compressed multiple pattern matching, Combinatorial Pattern Matching : 23rd Annual Symposium, CPM 2012, Date Jul. 5, 2012, pp. 232-242, vol. 7354, ISBN -978-3-642-31264-9, Springer.

* cited by examiner

| | Input String | Code (Bits) | Previous Token | Next Symbol | Basic Partition | Extended Partition | Unused Flag |
|---|---|---|---|---|---|---|---|
| 420 → | NULL | | EMPTY | | 1 : A<br>2 : B<br>...<br>20 : T | | |
| 431 → | T | 20 (10100) | EMPTY | T | | | |
| 432 → | O | 15 (01111) | TO | O | 21 : TO | | |
| 433 → | B | 2 (00010) | OB | B | 22 : OB | 31 : TOB | No |
| 434 → | TOB | 31 (11111) | BT | T | 23 : BT | 30 : OBT | Yes |
| 435 → | N | 14 (01110) | TOBN | N | 24 : TOBN | 29 : BTO | Yes |
| 436 → | | | | O | 25 : NO | 28 : TOBNO | Yes |
| 440 → | | | | | 31 : TOB | | |
| 451 → | O | 15 (01111) | --- | T | 26 : OT | | |
| 452 → | T | 20 (10100) | --- | T | 27 : TT | | |
| 453 → | TOB | 31 (11111) | --- | E | 28 : TOBE | | |
| 454 → | E | 5 (00101) | --- | O | 29 : EO | | |
| 455 → | O | 15 (01111) | --- | R | 30 : OR | | |
| 461 → | R | 18 (10010) | OR | T | 32 : RT | 63 : ORT | Yes |
| 462 → | TOBE | 28 (011100) | RT | O | 33 : TOBEO | 62 : RTO | Yes |
| 463 → | OR | 30 (011110) | TOBEO | N | 34 : ORN | 61 : TOBEOR | Yes |
| 464 → | NO | 25 (011001) | ORN | T | 35 : NOT | 60 : ORNO | Yes |
| 465 → | T | 20 (010100) | --- | # | | | |

FIG. 4

| | Code (Bits) | Output String | Previous Token | Previous String | Basic Partition | Extended Partition | Unused Flag |
|---|---|---|---|---|---|---|---|
| 520 | | | | | 1 : A | | |
| | | | | | 2 : B | | |
| | | | | | ⋮ | | |
| | | | | | 20 : T | | |
| 531 | 20 (10100) | T | EMPTY | EMPTY | | | |
| 532 | 15 (01111) | O | EMPTY | T | 21 : TO | | |
| 533 | 2 (00010) | B | TO | O | 22 : OB | | |
| 534 | 31 (11111) | TOB | OB | B | 23 : BT | 31 : TOB | No |
| 535 | 14 (01110) | N | BT | TOB | 24 : TOBN | 30 : OBT | Yes |
| 536 | 15 (01111) | O | TOBN | N | 25 : NO | 29 : BTO | Yes |
| 540 | | | | | 31 : TOB | 28 : TOBNO | Yes |
| 551 | 20 (10100) | T | --- | O | 26 : OT | | |
| 552 | 31 (11111) | TOB | --- | T | 27 : TT | | |
| 553 | 5 (00101) | E | --- | TOB | 28 : TOBE | | |
| 554 | 15 (01111) | O | --- | E | 29 : EO | | |
| 555 | 18 (10010) | R | --- | O | 30 : OR | | |
| 561 | 28 (011100) | TOBE | OR | R | 32 : RT | 63 : ORT | Yes |
| 562 | 30 (011110) | OR | RT | TOBE | 33 : TOBEO | 62 : RTO | Yes |
| 563 | 25 (011001) | NO | TOBEO | OR | 34 : ORN | 61 : TOBEOR | Yes |
| 564 | 20 (010100) | T | ORN | NO | 35 : NOT | 60 : ORNO | Yes |
| 570 | 0 (000000) | # | | | | | |

FIG. 5

LOSSLESS DATA COMPRESSION WITH VARIABLE WIDTH CODES

BACKGROUND OF THE INVENTION

1. Technical Field

The present disclosure relates to data compression technologies and more specifically to lossless data compression with variable width codes.

2. Related Art

Data compression refers to representing input data with fewer data bits. The resulting compressed data may be processed (decompressed) at a later time to recover the original input data. Such compression and decompression are generally useful for storing or transmitting information in the form of fewer bits. In general, the ratio of the size of the compressed data to the input data is referred to as compression ratio.

Lossless data compression refers to approaches in which the decompressed data exactly matches the original data at least during normal operation. This is in contrast to lossy compression, where the decompressed data contains information less than the original data, but may obtain higher compression ratios. Lossless compression is generally desirable when compressing textual information, while lossy compression is often used when compressing image data (visual information).

Codes are integral to compression techniques. Typically a small portion of an input data ("string") is encoded in the form of a corresponding code in generating the compressed data. The number of bits in a code is termed as its width. Codes with smaller width (fewer bits) are sought to be chosen to represent potentially repeating long strings (more bits) to obtain desired compression.

There are several compression techniques which use variable width codes, implying that different strings are encoded using codes of different widths. Such use of variable width codes may further enhance the compression ratio. LZW, LZMW and LZAP are some of the commonly known lossless data compression techniques using variable width codes.

In general, it is desirable that the lossless compression techniques provide for data compression while meeting one or more of requirements such as improving the compression ratio, reducing the memory space and/or processing requirements, etc.

BRIEF DESCRIPTION OF THE DRAWINGS

Example embodiments of the present invention will be described with reference to the accompanying drawings briefly described below.

FIG. 4 illustrates the manner in which an (uncompressed) input data is compressed by a compression module in one embodiment.

FIG. 5 illustrates the manner in which a compressed data is decompressed by a compression module in one embodiment.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

1. Definitions

Figure 1:
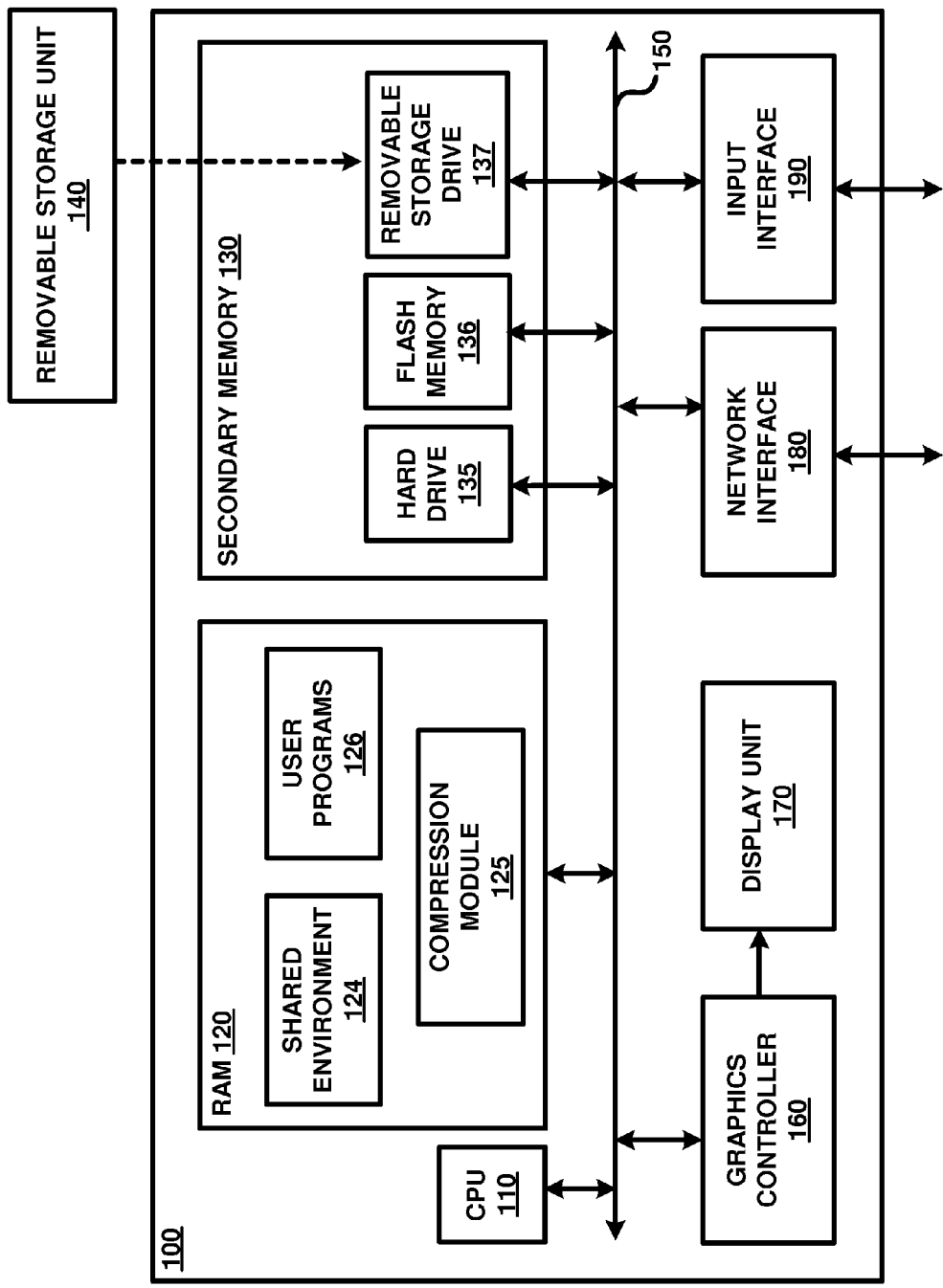
FIG. 1 is a block diagram illustrating the details of a digital processing system in which several aspects of the present invention are operative by execution of appropriate software instructions.

Input stream/data: Sequence of bits sought to be compressed

Output stream/data: Sequence of bits generated by compression

Symbol: The basic/smallest unit of input stream examined by the compression technique. In embodiments described below, a symbol corresponds to a ASCII character represented using eight bits, though alternative embodiments can employ symbols of different lengths.

String: A sequence of symbols in the input stream that is encoded as a corresponding code in the output stream.

Codes: Each code is a digital value (or bits forming the value) that represents a corresponding string of the input stream. The output stream contains a sequence of codes formed according to the respective strings of the input stream.

Dictionary: Collection of codes and the respective sequence of symbols ("token") each code represents in the output stream. Dictionary is viewed as containing multiple entries, with each entry storing the association of a token with corresponding code.

2. Overview

An aspect of the present invention provides for lossless compression of an input stream using variable width codes. In an embodiment, in each of a sequence of iterations, an output code is emitted (to an output stream) corresponding to a longest string from a present symbol based on entries in a dictionary. In each iteration, two entries are thereafter added to the dictionary, with the first entry associating (the longest string+symbol succeeding said longest string in said input stream) to a first available code in the dictionary, and a second entry associating a (previous token+symbol succeeding said previous token in said input stream) to a second available code in the dictionary, wherein the previous token represents the token of a first entry in a previous iteration, and wherein '+' represents a text appending operation.

According to another aspect, a dictionary used for lossless compression is logically divided into two partitions. Data is maintained indicating whether each entry of the second partition is unused in an output stream. When sufficient unassigned codes are not present in the dictionary for a present/current width of the output code, the unused codes corresponding to the entries of the second partition are reused.

In an embodiment, the first partition stores the first entry of each iteration, while the second partition stores the second entry of each iteration until there are sufficient unassigned codes. When sufficient unassigned codes are not present, the first entry of the iteration is formed using the code of a unused entry in the second partition, thereby replacing the unused entry of the dictionary.

Several aspects of the present invention are described below with reference to examples for illustration. However, one skilled in the relevant art will recognize that the invention can be practiced without one or more of the specific details or with other methods, components, materials and so forth. In other instances, well-known structures, materials, or operations are not shown in detail to avoid obscuring the features of the invention. Furthermore, the features/aspects described can be practiced in various combinations, though only some of the combinations are described herein for conciseness.

3. Example System

FIG. 1 is a block diagram illustrating the details of digital processing system 100 in which several aspects of the present invention are operative by execution of appropriate software instructions. Digital processing system 100 may contain one or more processors such as a central processing unit (CPU) 110, random access memory (RAM) 120, secondary memory 130, graphics controller 160, display unit 170, network interface 180, and input interface 190. All the components except display unit 170 may communicate with each other over communication path 150, which may contain several buses as is well known in the relevant arts. The components of FIG. 1 are described below in further detail.

CPU 110 may execute instructions stored in RAM 120 to provide several features of the present invention. CPU 110 may contain multiple processing units, with each processing unit potentially being designed for a specific task. Alternatively, CPU 110 may contain only a single general-purpose processing unit.

RAM 120 may receive instructions from secondary memory 130 using communication path 150. RAM 120 is shown currently containing software instructions constituting shared environment 124, compression module 125 and/or user programs 126 (such as client applications, Web browser, RDBMS, etc.). Shared environment 124 includes operating systems, device drivers, virtual machines, etc., which provide a (common) run time environment for execution of compression module 125 and user programs 126. Compression module 125, provided according to several aspects of the present invention, compresses input data/stream according to a lossless compression technique as described in detail in below sections. User programs 126 may use compression module 125 for compression/decompression of data, and compression module 125 may be viewed as one of the user programs as well.

Graphics controller 160 generates display signals (e.g., in RGB format) to display unit 170 based on data/instructions received from CPU 110. Display unit 170 contains a display screen to display the images defined by the display signals. Input interface 190 may correspond to a keyboard and a pointing device (e.g., touch-pad, mouse) and may be used to provide inputs. Network interface 180 provides connectivity to a network (e.g., using Internet Protocol), and may be used to communicate with other systems (such as those shown in FIG. 1) connected to the network.

Secondary memory 130 may contain hard drive 135, flash memory 136, and removable storage drive 137. Secondary memory 130 may store the data (e.g., portions of the input and output data of FIGS. 4 and 5, described below) software instructions, which enable digital processing system 100 to provide several features in accordance with the present invention. In particular, the software instructions may contain instructions (in the form of object modules, linked modules, etc.), which are together executed in the form of compression module 125.

Some or all of the data and instructions may be provided on removable storage unit 140, and the data and instructions may be read and provided by removable storage drive 137 to CPU 110. Floppy drive, magnetic tape drive, CD-ROM drive, DVD Drive, Flash memory, removable memory chip (PCMCIA Card, EPROM) are examples of such removable storage drive 137.

Removable storage unit 140 may be implemented using medium and storage format compatible with removable storage drive 137 such that removable storage drive 137 can read the data and instructions. Thus, removable storage unit 140 includes a computer readable (storage) medium having stored therein computer software and/or data. However, the computer (or machine, in general) readable medium can be in other forms (e.g., non-removable, random access, etc.).

In this document, the term "computer program product" is used to generally refer to removable storage unit 140 or hard disk installed in hard drive 136. These computer program products are means for providing software to digital processing system 100. CPU 110 may retrieve the software instructions, and execute the instructions to provide various features of the present invention described above.

Reference throughout this specification to "one embodiment", "an embodiment", or similar language means that a particular feature, structure, or characteristic described in connection with the embodiment is included in at least one embodiment of the present invention. Thus, appearances of the phrases "in one embodiment", "in an embodiment" and similar language throughout this specification may, but do not necessarily, all refer to the same embodiment.

Furthermore, the described features, structures, or characteristics of the invention may be combined in any suitable manner in one or more embodiments. In the above description, numerous specific details are provided such as examples of programming, software modules, user selections, network transactions, database queries, database structures, hardware modules, hardware circuits, hardware chips, etc., to provide a thorough understanding of embodiments of the invention.

The description is continued illustrating the manner in which compression module 125 compresses data according to several aspects of the present invention.

4. Data Compression

Figure 2:
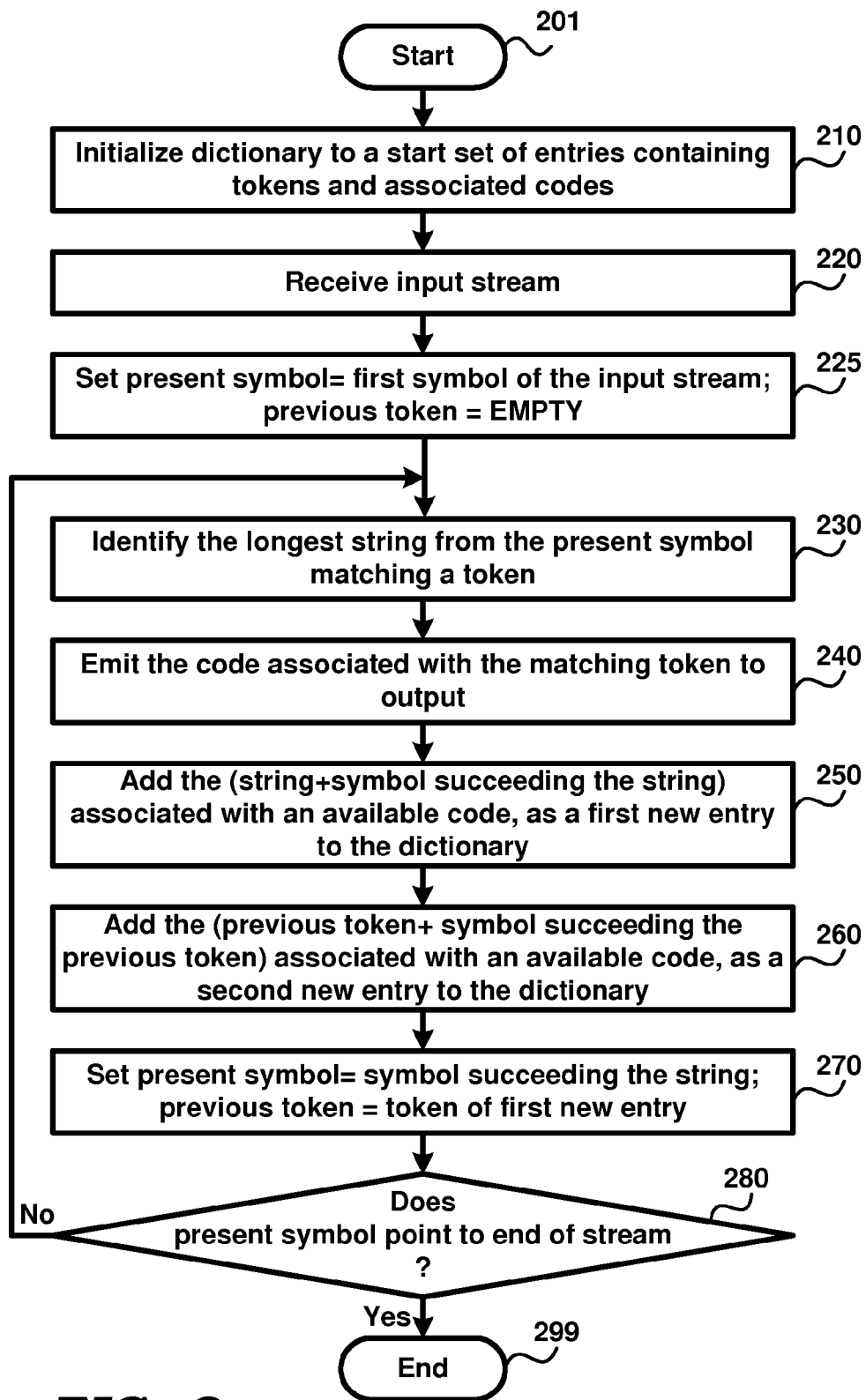
FIG. 2 is a flow chart illustrating the manner in which input data is compressed according to an aspect of the present invention.

FIG. 2 is a flow chart illustrating the manner in which input data is compressed according to an aspect of the present invention. The flowchart is described with respect to the system of FIG. 1 merely for illustration. However, the features can be implemented in other systems and environments also without departing from the scope and spirit of various aspects of the present invention, as will be apparent to one skilled in the relevant arts by reading the disclosure provided herein.

In addition, some of the steps may be performed in a different sequence than that depicted below, as suited to the specific environment, as will be apparent to one skilled in the relevant arts. Many of such implementations are contemplated to be covered by several aspects of the present invention. The flow chart begins in step 201, in which control immediately passes to step 210.

In step 210, a dictionary is initially set to a start set of entries containing tokens and associated codes. In one embodiment, the number of entries in the initial set equals the number of symbols, with each entry having a symbol as the token and a corresponding code. Such an initial set ensures that every symbol of the input stream can be matched and processed by compression module 125 as described below.

In step 220, compression module 125 receives an input stream containing a sequence of symbols. The term stream implies an ordinal sequence of symbols is received as input. It may be appreciated that all the symbols may be received prior to start of compression (as described below) or the symbols may be received at different time instances.

In step 225, compression module 125 sets the present symbol to the first (ordinal) symbol of the input stream and a previous token to EMPTY (i.e., indicating that none exists), to start the compression operation. It should be appreciated that the words first, second, etc., are mere labels, as would be clear from the corresponding context. However, the same words have ordinal implication when referring to specific position in a sequence, as will also be clear from the corresponding context.

In step 230, compression module 125 identifies a string from the present symbol matching a token. In other words, different sequences of symbols, each starting from and including the present symbol, may be compared with the different tokens present in the dictionary, and the longest one of such matching sequences is identified as the string. Such comparisons may be performed in a known way (e.g., a tree-based matching).

In step 240, compression module 125 emits the code associated with the matching token (in the dictionary) to the output stream. The emitting of the code indicates that the string in the input data has been processed/compressed.

In step 250, compression module 125 adds a first new token associated with an available code as a first new entry to the dictionary, wherein the first new token is formed by appending ('+') the symbol succeeding the string in the input stream to the matched string. A code is deemed to be available if the compression approach permits the code to be associated with a new token.

In step 260, compression module 125 adds a second new token associated with an available code as a second new entry to the dictionary, wherein the second new token is formed by appending to the previous token, the symbol succeeding the previous token in the input stream.

Thus, steps 250 and 260 operate to expand the number of entries in the dictionary, thereby facilitating compression of later longer strings (in the input stream). During the first iteration when previous token is EMPTY, step 260 is inoperative, and thus only a single entry is added to the dictionary.

In step 270, compression module 125 sets present symbol to the symbol succeeding the string and the previous token to the token of first new entry noted above. Such setting of the present symbol ensures that the compression continues from the not-yet-processed symbol of the input stream. The setting of the previous token facilitates the generation of the second new entry (in step 260) during the later iterations.

In step 280, compression module 125 checks whether the present symbol points to the end of stream. Such end may be represented by a suitable convention and the checking needs to be consistent with such convention. Control passes to step 299 if the end of stream is reached, and to step 230 otherwise. The flow chart ends in step 299.

Thus, the steps 230 through 280 are iteratively performed until all of the symbols in the input stream are processed. The corresponding output stream (containing the codes emitted in step 240) represents the compressed data for the input data.

The inclusion of additional entry in step 260 enhances the probability of usage of codes of smaller width to represent potentially repeating long strings in the input stream. However, one problem with such inclusion of the additional entry in each iteration, is that the number of entries in the dictionary increases rapidly (at least compared to a scenario when only one entry is added for each similar iteration).

Another aspect of the present invention facilitates the management of codes/entries in a dictionary, as described below with examples.

5. Dictionary Management

Figure 3:
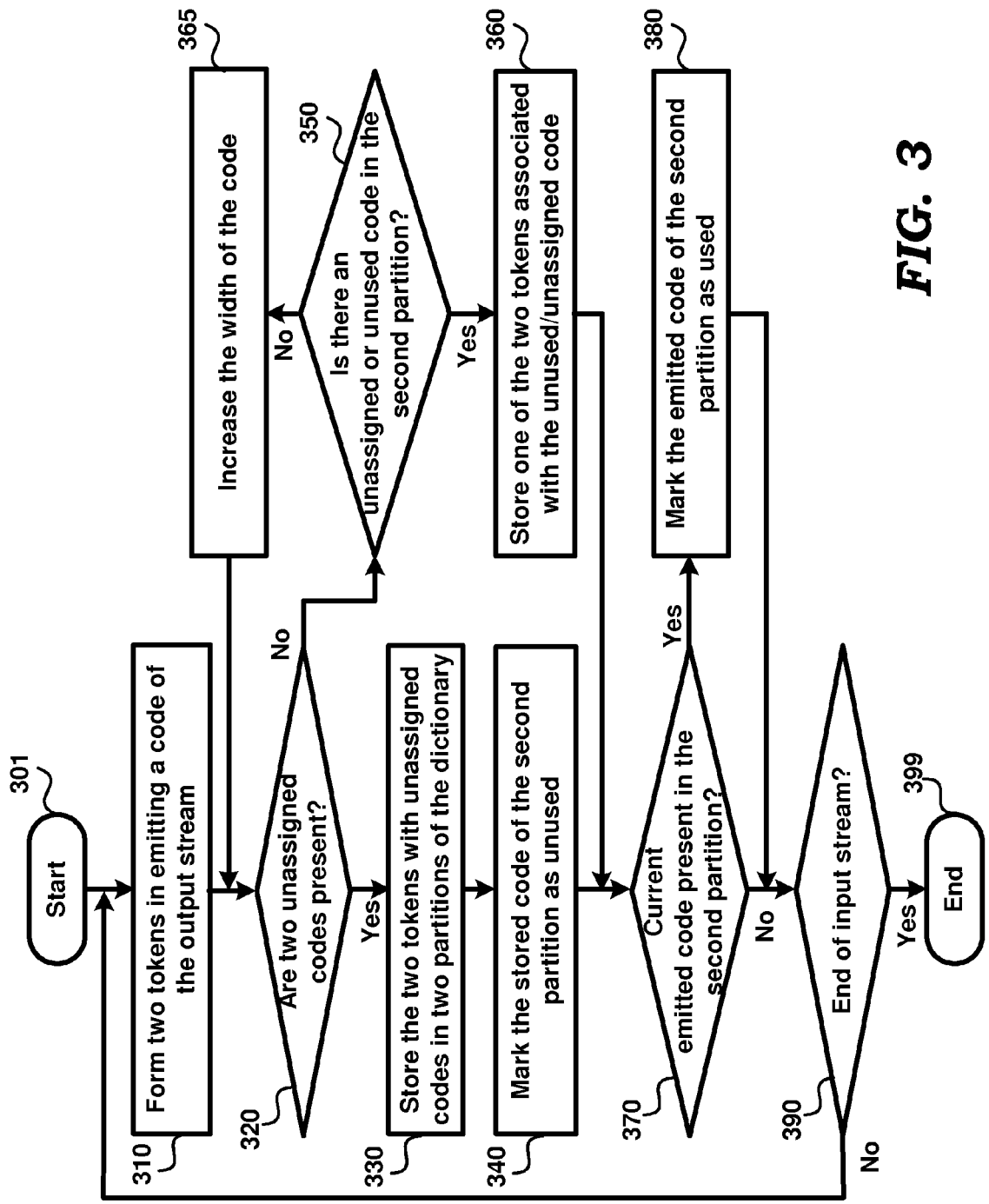
FIG. 3 is a flow chart illustrating the manner in which codes/entries in a dictionary are managed when multiple entries are added to the dictionary according to an aspect of the present invention.

FIG. 3 is a flow chart illustrating the manner in which codes/entries in a dictionary are managed when multiple entries are added to the dictionary according to an aspect of the present invention. The flowchart is described with respect to the system of FIG. 1 and the operation of FIG. 2 merely for illustration. However, the features can be implemented in other systems/environments and in the context of other compression approaches, without departing from the scope and spirit of various aspects of the present invention, as will be apparent to one skilled in the relevant arts by reading the disclosure provided herein.

In addition, some of the steps may be performed in a different sequence than that depicted below, as suited to the specific environment, as will be apparent to one skilled in the relevant arts. Many of such implementations are contemplated to be covered by several aspects of the present invention. The flow chart begins in step 301, in which control immediately passes to step 310.

In step 310, compression module 125 forms two tokens in emitting a code of the output stream. The two tokens may correspond to those generated in steps 250 and 260 for the code emitted in step 240. However, the approach of FIG. 3 can be implemented when other tokens (generated according to different conventions and approaches) are added, as will be apparent to one skilled in the relevant arts by reading the disclosure provided herein.

In step 320, compression module 125 checks whether two unassigned codes are present based on the current entries in the dictionary. Control passes to step 330 if such two unassigned codes are determined to be present and to step 350 otherwise.

In step 330, compression module 125 stores the two tokens associated with respective unassigned codes in two partitions of the dictionary. The tokens generated in step 250 may be stored in a first partition, while the tokens generated in step 260 may be stored in a second partition. In general, tokens requiring different processing are stored in corresponding different partitions. Such different processing is illustrated with respect to the second partition below.

In step 340, compression module 125 marks the stored code of the second partition as unused. Any suitable convention may be used to indicate such unused status of the codes in the second partition. Control then passes to step 370.

In step 350 (when two unassigned codes are not present), compression module 125 checks whether there exists an unassigned code (in either partition) or an unused code (in the second partition). A code satisfying either criteria may be viewed as an available code. As may be observed, an unused code refers to a code that is already assigned to a token, but has not been emitted to the output stream. Control passes to step 360 if an available code exists and step 365 otherwise.

In step 360, compression module 125 stores one of the two tokens associated with the available code in the dictionary. It may be appreciated that when the available code corresponds to an unused code in the second partition, such association amounts to overriding of the previous (unused) association. Such a reuse of codes avoids potentially unneeded increase of code width. Control then passes to step 370.

In step 365, when there is no available code, compression module 125 increases the width of the code, usually by a single bit, thereby doubling the total number of codes. After such increase, unassigned codes are present for association to tokens. Control then passes to step 320, and further to steps 330 and 340 (since the codes are now present) wherein the two codes are stored.

In step 370, compression module 125 checks whether the current emitted code (e.g., emitted in step 310/240) is present in the second partition. If the emitted code is not present in the second partition, control passes to step 390. Alternatively, if the emitted code is present, control first passes to step 380 where the emitted code of the second partition is marked as having been used (not unused), and then to step 390.

In step 390, compression module 125 checks whether the end of input stream is reached. Such a check may be performed similar to step 280 noted above, for example, by using suitable conventions. If the end of stream is determined to be not reached, control passes to step 310 whereby the steps of FIG. 3 are repeated for the rest (unprocessed portions) of the input stream. Otherwise (when end of input stream is reached), control passes to step 399 where the flow chart ends.

Thus, compression module 125 manages the codes/entries in a dictionary when multiple entries are added to the dictionary. It may be appreciated that by maintaining different partitions in the dictionary and then reusing unused codes, smaller width codes may potentially be used for encoding longer strings (with more number of symbols). Accordingly, the compression technique according to several aspects of the present invention may achieve higher compression ratios, as compared to other techniques noted above.

The description is continued illustrating the manner in which compression module 125 implements the steps of FIGS. 2 and 3 to provide several aspects of the present invention.

6. Illustrative Example

FIGS. 4 and 5 together illustrate the manner in lossless compression of data are performed in one embodiment. For illustration, it is assumed that the set of possible different symbols (in the input stream contains only the characters from "A" to "T" (all in upper case, and represented by corresponding ASCII 8 bit code). The different symbols may appear in any desired sequence/combination in the input stream. It is further assumed that the end of the input stream is represented by the character "#". The manner in which an input stream/data containing the sequence of characters "TOBTOBNOTTOBEORTOBEORNOT#" (hereafter referred to as the "uncompressed sequence") is first compressed and then later decompressed to retrieve the original data is described in detail below.

As noted above, the compression/decompression of data is performed based on a dictionary containing entries that associate tokens with corresponding codes. Compression module 125 first initializes the dictionary to a start set of entries, each entry in the start set associating a token formed by a one of the set of possible different symbols ("A" to "T") to a corresponding code. Compression module 125 may select an initial width of the output code based on the number of entries in the start set.

For example, as there are 20 entries (equal to the number of symbols), a code width of 5 bits is chosen by compression module 125 and correspondingly codes 1 to 20 are respectively assigned to the symbols "A" to "T". It may be noted that after adding the start set of entries to the dictionary, the unassigned/available codes are from 21 (the first unassigned value) through 31 (the maximum value that can be represented by 5 bits). It should be further noted that for convenience, each code is referred by the corresponding digital/decimal value, though in actual implementation, only the bits forming the digital value is emitted to the output stream.

According to an aspect of the present invention, the entries in the dictionary are grouped into two partitions (hereafter referred to as "basic" and "extended" partitions). The start set of entries are assumed to be present in the basic/first partition, with new entries being added to any desired one or both of the partitions. In the following description, it is assumed that new entries added to the first partition use the unassigned codes in the ascending order (that is, starting from the smallest unassigned code and increasing sequentially), while the new entries added to the second partition use the unassigned codes in the descending order (that is, starting from the largest unassigned code and decreasing sequentially).

Thus, for the dictionary noted above, the start set of entries associating the tokens "A" through "T" respectively to the codes 1 to 20 are initially included in the basic partition. New entries to the basic partition are added by using (associating the tokens with) the unassigned codes 21, 22, 23, etc. (in the ascending order) while entries to extended partition are added using the unassigned codes 31, 30, 29, etc. (in the descending order). It should be noted that the specific codes that may be used for entries in each partition changes when the width of the code is later changed (increased).

It may be appreciated that in alternative embodiments, other desired sets of codes (and corresponding orders) may be chosen for assignment to entries of corresponding partitions. For example, the new entries to the basic partition may use odd codes (21, 23, 25, etc.), while new entries to the extended partitions may use even codes (22, 24, 26, etc.). In general, any two non-overlapping sets of codes may be used for adding the new entries to the respective partitions.

In addition to the dictionary, compression module 125 also maintains a usage data indicating whether each entry of the extended/second partition is unused (that is, not emitted) in the output stream. In one embodiment, compression module 125 maintains an unused flag corresponding to each of the entries in the second partition. The value ("Yes" or "No") of an unused flag indicates whether the corresponding entry is unused (value "Yes") or not (value "No"). In alternative embodiments, any convenient convention may be used to track the usage of the entries in the second partition.

The description is continued illustrating the manner in which compression of the uncompressed sequence (noted above) may be performed by compression module 125 according to several aspects of the present invention.

7. Compressing Input Data

FIG. 4 illustrates the manner in which an (uncompressed) input data is compressed by compression module 125 in one embodiment. In particular, table 400 illustrates the manner in which the uncompressed sequence is compressed by compression module 125 using the dictionary/usage data noted above.

Column 411 "Input String" indicates the longest string (here, a sequence of characters) in the input stream/sequence that has a matching token present in the dictionary, column 412 "Code (Bits)" indicates the specific output code (and the corresponding bits) that is emitted to the output string corresponding to the matched "Input String". Column 413 "Previous Token" indicates the previous token added to the basic partition of the dictionary, in particular, the previous token formed by the previous matched string+succeeding symbol in the input stream. Column 414 "Next Symbol" indicates the next character following the matched longest string in the input stream.

Each of columns 415 "Basic Partition" and 416 "Extended Partition" respectively indicates the entries in the basic and extended partitions of the dictionary. Each entry in the dictionary is shown of the form "code:token". Furthermore, all of the entries present in each partition are shown only at the start of the compression/decompression process (in rows 420 and 520). In the other rows, only the newly added entries to each partition are shown for conciseness. However, the previous entries are deemed to be present in the partition, unless noted otherwise in the description below. Column 417 "Unused Flag" indicates whether the corresponding entry of the extended partition (shown in column 416) is unused (value "Yes") in the output stream or not (value "No").

Each of the rows of table 400 specifies a corresponding state (of the various variables, dictionary, input and output streams) during the compression of the input data. For example, row 420 indicates a start state prior to start of compression, wherein the basic partition of the dictionary is shown initialized to a start set of entries. As noted above, the start set of entries contains each of the set of possible different symbols "A" through "T" associated with the corresponding codes 1 through 20.

Row 431 indicates the start of compression, when there is no matched input string. The previous token and the next symbol are shown respectively set to EMPTY and "T" (the first character in the input stream). It may be appreciated that the next symbol in each iteration represents the present symbol during the next iteration. Accordingly, during the next iteration, compression module 125 finds an input string from the character "T" matching a token in (either partition of) the dictionary.

Each of rows 432-436 (a first sequence of iterations) indicates the state after successive iterations during compression of the input data. In particular, row 432 indicates that after the first iteration, the longest input string matching a token is "T", the code (and corresponding bits) associated to the matching token emitted to the output string is 20 (10100), the previous token is EMPTY, and the next symbol is "O". Row 432 also indicate that the new entry added to the basic partition is "21: TO", where "TO" is formed based on longest/input string (column 411)+next symbol (column 414) in the uncompressed sequence, while 21 represents the next available code. It should be noted that no new entry is added to the extended partition since the previous token is EMPTY.

Row 433 indicates that the next matching input string is "O", the code (bits) emitted to the output string is 15 (01111), the previous token is "TO" (the previous entry in the basic partition) and the next symbol is "B". As noted above, compression module 125 first forms two new tokens (as OB=input string+next symbol and TOB=previous token (column 413)+ succeeding symbol of previous token) to be added to the dictionary, and then checks whether there are two unassigned codes present in the dictionary.

In one embodiment, compression module 125 determines that two unassigned codes are present only if there exists at least one unassigned code in each of the basic and extended partition. Thus, upon determining that code 22 in the basic partition and code 31 in the extended partition are available, compression module 125 adds the two new tokens to the two partitions of the dictionary. Row 433 is accordingly shown indicating the entries "22: OB" and "31: TOB" as being added respectively to the basic and extended partitions. Though not shown, it should be appreciated that the value for the Unused Flag for row 433 is initially set to "Yes" to indicate that the corresponding code 31 is unused in the output stream.

Similarly, each of rows 434-436 indicates the state after respective iterations following row 433. It may be observed that in each of these iterations, compression module 125 determines that two unassigned codes are present and accordingly adds the tokens associated with corresponding unassigned codes respectively to the basic and extended partition.

It may be further observed that the Unused Flag for each of the entries (such as OBT, BTO, and TOBNO) in the extended partition is indicated to be "Yes". However, the value of the Unused Flag in row 433 is changed to "No" to indicate that the code 31 (corresponding to token "TOB") has been used/ emitted in the output stream (row 435).

The above noted first sequence of iterations (rows 432-436) may be further continued until all the unassigned codes in the basic and extended partitions have been used/assigned. However, in one embodiment, the first sequence of iterations is stopped when there is only a difference of 2 (or less) between the next unassigned codes in the basic and extended partitions. The stopping of the first set of iteration where two entries are added to the dictionary and then switching to a second set of iterations (noted in detail below) adding a single entry enables additional unused codes in the second partition to be reused and avoid unnecessary increasing of the code width.

Thus, after the iteration of row 436, the next unassigned codes in the basic and extended partitions are 26 and 27 respectively. Since the difference is less than 2 (that is, there is only 1 unassigned code in each of the basic and extended partitions), compression module 125 stops the first sequence of iterations (even though there are two unassigned codes present in the dictionary). Compression module 125 then determines the existing entries in the extended partition that have been indicated to be not unused (value "No" in column 417) and merges the determined entries to the basic partition. The merging of the entries may be performed by marking the entries as belonging to the basic partition (without actually performing any in-memory movement of data). Such merging ensures that the merged entries in the basic partition are not replaced during further processing of the input stream, as described in detail below.

Row 440 indicates the state of the basic partition after the merging of the entry "31: TOB" (the only entry having the value "No" in rows 432-436) from the extended partition to the basic partition. All the other codes (such as 28, 29, and 30) previously assigned to entries in the extended partition and which are unused in the output stream are identified as possible codes for replacement. It should be appreciated that the unused information is not maintained for the entries of the basic partition, and therefore the entries of the first/basic partition are not candidates for such replacement.

Each of rows 451-455 indicates the state after successive iterations of a second sequence (of iterations) following the first sequence noted above. During each iteration in the second sequence, compression module 125 determines that two unassigned codes are not present (in particular, there is no unassigned code in the basic partition). Compression module 125 then checks whether there exists an unassigned/unused code in the extended partition. Upon identifying an unused code (such as 28, 29 and 30) is present in the extended partition, compression module 125 stores the first token (input string+next symbol) associated with the unused code in the basic partition.

Thus, each of the entries having an unused code in the extended partition is replaced by a new entry having the same unused code in the basic partition. Accordingly, in rows 451-455, new entries are shown added only to the basic dictionary and some of the new entries as in rows 453-455 are shown using the codes (28, 29 and 30) previously used in the entries of the extended partition (rows 436, 435 and 434 respectively). The state of the previous token (column 413) in each of rows 451-455 is shown as three dashes ("- - -") to indicate that the value of the previous token is not relevant, since the value is not used during the iteration.

It may be observed that after the second sequence of iterations (rows 451-455), all the codes from 1-31 (the maximum code possible with a width of 5 bits) have been assigned in the dictionary. As such, during the processing of the next input string "R" (shown in row 461), compression module 125 determines that there are no unassigned/unused codes in the dictionary and accordingly increases the width of the output code by 1 bit (that is, to 6 bits). The addition of the 1 bit doubles the total number of codes (to 64), of which half of the codes (from 32-63) are unassigned. Following the change in the width, new entries to the basic partition are added by using the unassigned codes 32, 33, 34, etc. (in the ascending order) while entries to extended partition are added using the unassigned codes 63, 62, 61, etc. (in the descending order).

Row 461 indicates the state after the code width has been increased and corresponding processing performed. In particular, row 461 indicates that the new entry added to the basic partition is "32: RT", while the new entry added to the extended partition is "63: ORT". Similarly, each of rows 462-465 indicates the state after successive iterations for code width of 6 bits during compression of the uncompressed sequence. In row 465, the next symbol is shown to be "#", thereby indicating the end of the uncompressed sequence, and accordingly no further iterations are performed.

It may be appreciated that the iterations of rows 461-464 are similar to the first sequence of iterations (rows 432-436), where two entries are added to the basic and extended partitions of the dictionary. In general, the combination of a first sequence of iterations (when two entries are added), determining and merging of entries (of the extended partition) with the basic partition, a second sequence of iterations (when only one entry is added to basic dictionary) and increasing the width of the output code are repeatedly performed until all of the symbols in the input data/sequence are processed/compressed.

It may be observed in column 412 that the output codes are of a width of 5 bits (in rows 432-436, 451-455 and 461) before the increase of the width, but thereafter the codes are of a width of 6 bits (in rows 462-465). Even codes (such as 28, 30, 25, 20) that are encoded as 5 bits in the dictionary are shown as being emitted as 6 bits wide, with the leading bits being specified as 0. In general, after the width of the output code is changed/increased to a new width, all codes emitted to the output are thereafter of the new width (with the required number of leading zeros added to the code in the dictionary).

Furthermore, it should be noted that the different codes shown in column 412 are emitted successively during each iteration, thereby forming an output stream of bits. The output stream of column 412 (hereafter referred to as the "compressed sequence") represents the compressed form/data of the uncompressed sequence noted above. It may be noted that the original uncompressed sequence is specified using 192 bits (24 characters multiplied by 8 bits per ASCII character), while the compressed sequence requires only 79 bits (11 codes of 5 bits each+4 codes of 6 bits each). Thus, a compression ratio of 0.41 (=79 divided by 192) is achieved when compressing the above noted uncompressed sequence.

The compressed sequence may be stored in a secondary memory (such as 130) for later use and/or sent to another digital processing system (not shown) over a network. Additional information that may be required for performing decompression such as the set of possible different symbols, the starting code width, etc. may also be stored/sent along with the compressed sequence. The compressed sequence and the additional information is typically stored/send in the form of a "compressed file".

The description is continued assuming that digital processing system 100 receives such as compressed file (containing the above noted compressed sequence) over a network using network interface 180, and that compression module 125 is enabled to decompress such compressed data/file as well. The manner in which compression module 125 decompresses the compressed data based on the additional information is described below with examples.

8. Decompressing Compressed Data

FIG. 5 illustrates the manner in which a compressed data is decompressed by compression module 125 in one embodiment. In particular, table 500 illustrates the manner in which the compressed sequence (of column 412) is decompressed by compression module 125 according to several aspects of the present invention. As noted above, it is assumed that compression module 125 receives along with the compressed sequence, the set of possible different symbols as "A" to "T" and the starting code width as 5 bits.

Column 511 "Code (Bits)" indicates the specific code (and the corresponding bits) that is received as input, while column 512 "Output String" indicates the string (here, a sequence of characters) that is emitted to the output stream corresponding to the received specific code. Column 513 "Previous Token", similar to column 413, indicates the previous token added to the basic partition of the dictionary. Column 514 "Previous String" indicates the string emitted to the output during a previous iteration. Each of columns 515-517 are similar respectively to columns 415-417 of FIG. 4 and accordingly their description is not repeated here for conciseness.

Each of the rows of table 500 specifies a corresponding state (of the various variables, dictionary, input and output streams) during the decompression of the input/compressed data. Row 520, similar to row 420, indicates a start state prior to start of decompression, wherein the basic partition of the dictionary is shown initialized to a start set of entries. The start set of entries may be generated based on the additional information (in particular, the set of possible different symbols) received along with the compressed sequence.

After initializing the dictionary, compression module 125 receives the bits forming the compressed sequence. Compression module 125 then determines the codes in the received stream of bits based on the starting code width (either received as part of the addition information or determined based on the set of possible symbols). For the compressed data noted above, compression module 125 starts forming codes of 5 bits each, based on the starting code width of 5 bits.

Accordingly, in row 531 indicating the start of decompression, a first code (20) is shown as being received as part of the compressed data. Compression module 125 identifies the token (T) corresponding to the received code in the dictionary and emits the identified token to the output stream. Row 531 also indicates that the previous token and the previous string are both set to EMPTY, since there is no previous input/data.

Each of rows 532-536 (similar to the first sequence of iterations, noted above) indicates the state after successive iterations during decompression of the input data. In particular, row 532 indicates that after the first iteration, the input code is 15 (01111), the corresponding output string is "O" (based on the dictionary), the previous token is still EMPTY, and the previous string is "T" (which is the output string in row 531). Row 532 also indicate that the new entry added to the basic partition is "21: TO", where "TO" is formed based on previous string (column 514)+succeeding symbol of the previous string according to the uncompressed output (the first character in the output string of column 512), while 21 represents the next available code. It should be noted that no new entry is added to the extended partition since the previous token is EMPTY.

Row 533 indicates that the next code is 2 (00010), the corresponding output string is "B", the previous token is "TO" (the previous entry in the basic partition) and the previous string is "O". Compression module 125 first forms two new tokens (as OB=previous string+succeeding symbol of previous string and TOB=previous token (column 513)+succeeding symbol of previous token in the uncompressed output of column 512) to be added to the dictionary, determines that there are two unassigned codes present in the dictionary (similar to the checking noted above with respect to compression) and then adds the two tokens as corresponding entries "22: OB" and "31: TOB" respectively to the basic and extended partitions. The Unused Flag values in column 517 are set similar to that noted above with respect to column 417.

Similarly, each of rows 534-536 indicates the state after respective iterations following row 533. After the iteration of row 536, since the difference between the unassigned codes in the two partitions is less than 2, compression module 125 determines the existing entries in the extended partition that have been indicated to be not unused (value "No" in column 517) and merges the determined entries with the basic partition. Row 540 indicates the state of the basic partition after the merging of the entry "31: TOB". Each of rows 551-555 indicates the state after successive iterations (similar to the second sequence of iterations, noted above) after the merging of the used entries to the basic partition. During each of the iterations of rows 551-555, the unused entries in the extended partition are replaced by new entries in the basic partition, similar to the operation of rows 451-455 noted above.

It may be observed that after the iteration of row 555, all the codes from 1-31 (the maximum code possible with a width of 5 bits) have been assigned in the dictionary. As such, compression module 125 increases the width of the output code by 1 bit (that is, to 6 bits), and starts forming codes in the input/compressed sequence based on the new width (6 bits each). Thus, in row 561, a 6 bit code (28) is shown as being received as part of the compressed data. Row 561 also indicates that the new entry added to the basic partition is "32: RT", while the new entry added to the extended partition is "63: ORT", where the unassigned codes are now based on 6 bits (the new input code width).

Similarly, each of rows 562-565 indicates the state after successive iterations for code width of 6 bits during de compression of the uncompressed sequence. In row 570, the code "000000" (zero) is shown as received. Compression module 125 is accordingly shown emitting the end of stream symbol "#" to the output stream, thereby indicating the end of the decompressed data and thereby the processing of the input/compressed data.

As noted above with respect to compression of data, the above noted steps may be repeatedly performed until all of the codes in the compressed data/sequence are processed/decompressed. The different strings shown in column 512 are emitted successively during each iteration, thereby forming an output/decompressed stream of bits (hereafter referred to as the "decompressed sequence") that represents the decompressed form/data of the compressed sequence noted above. It may be observed that the decompressed sequence is the same as the uncompressed sequence noted above, thereby indicating that the compression technique is lossless.

It should be appreciated that the decompression approach implements an 'inverse technique' corresponding to the compression approach also described above. Thus, if the compressed data C is generated by a function F (input data), the inverse technique may be represented as $F^{-1}$ (compressed data) to generate the original uncompressed input data.

It should be further appreciated that the features of the invention are described above as being implemented in the form of executable modules. However, in alternative embodiments, the various features can be implemented as a desired combination of one or more of hardware, executable modules, and firmware, as will be apparent to one skilled in the relevant arts, by reading the disclosure provided herein.

9. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

It should be understood that the figures and/or screen shots illustrated in the attachments highlighting the functionality and advantages of the present invention are presented for example purposes only. The present invention is sufficiently flexible and configurable, such that it may be utilized in ways other than that shown in the accompanying figures.

Further, the purpose of the following Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

What is claimed is:

1. A method of processing data in a digital processing system, said method comprising:

receiving an input stream containing a sequence of symbols;

identifying a longest string from a present symbol matching a first token in a dictionary, said dictionary containing a plurality of entries, each entry associating a token to a corresponding code, a first entry of said plurality of entries associating said first token to a first code;

emitting the code corresponding to said first token in a corresponding entry, as an output code to an output stream;

adding a second entry and a third entry to said dictionary, wherein said second entry associates (said longest string+symbol succeeding said longest string in said input stream) to a first available code according to said dictionary, wherein said third entry associates (a previous token+symbol succeeding said previous token in said input stream) to a second available code according to said dictionary, wherein said previous token represents the token of said second entry in a previous iteration, wherein '+' represents a text appending operation, wherein said emitting and said adding are performed in response to said identifying of said longest string from said present symbol; and performing a next iteration of said identifying, said emitting and said adding with said present symbol set to the symbol succeeding said longest string in said input stream.

2. The method of claim 1, wherein said dictionary is initialized to a start set of entries before a first one of said iterations, wherein each of said start set of entries associates one of a set of possible different symbols in said input stream to a corresponding code, wherein the number of entries in said start set of entries equals the number of symbols in said set of possible different symbols.

3. The method of claim 1, wherein during a first sequence of iterations, said second entry and said third entry of each iteration are respectively stored in a first partition and a second partition of said dictionary, wherein during a second sequence of iterations following said first sequence of iterations, some of said entries of said second partition are replaced by said second entry of each of said second sequence of iterations.

4. The method of claim 3, further comprising:

maintaining data indicating whether each of said entries in said second partition is unused in said output stream during said first sequence of iterations, wherein said data indicates a first set of entries of said second partition as being unused by the end of said first sequence of iterations, wherein said some of said entries correspond to said first set of entries.

5. The method of claim 4, further comprising merging entries in said second partition other than said first set of entries to said first partition by the end of said first sequence of iterations and prior to start of said second sequence of iterations, wherein the replaced entries in said second sequence of iterations are added to said first partition, wherein no entries are added to said second partition during said second sequence of iterations.

6. The method of claim 5, wherein an increase in the width of said code increases the number of available codes for entries in said dictionary, wherein said first sequence of iterations are performed with a first width for said code, wherein said second sequence of iterations are also performed with said first width without increasing the width of said code, wherein the width of said code is increased from said first width, only after all of said first set of entries in said second partition are replaced.

7. The method of claim 6, wherein said first sequence of iterations and said second sequence of iterations are continued with increasing widths of said code until all of said sequence of symbol of said input stream are processed.

8. The method of claim 7, further comprising receiving a compressed stream as input, wherein said compressed stream is decompressed using an inverse technique corresponding to the method of claim 7.

9. A non-transitory machine readable medium storing one or more sequences of instructions for causing a digital processing system to process data, wherein execution of said one or more sequences of instructions by one or more processors contained in said digital processing system causes said digital processing system to perform the actions of:

receiving an input stream containing a sequence of symbols;

maintaining a dictionary containing a plurality of entries, wherein each entry associates a token to an assigned code, said plurality of entries being grouped into a first partition and a second partition said dictionary containing a first partition and a second partition;

emitting to an output stream, an output code corresponding to a string of said input stream, wherein said output code is the assigned code associated with a token matching said string in a first entry of said dictionary;

storing data indicating whether each entry of said second partition is unused in forming said output stream, wherein the data is stored to indicate that said first entry is not unused if said first entry is in said second partition;

forming a first token and a second token associated with processing of said string;

checking whether there are two codes not assigned in said dictionary for a present width of codes being assigned;

if there are two codes not assigned:

adding to said first partition a first entry associating said first token to one of the two codes not assigned, and adding to said second partition a second entry associating said second token to the other one of the two codes not assigned;

otherwise:

inspecting said data to determine a third entry of said second partition that is indicated to be unused; and adding a fourth entry associating said first token to the code of said third entry such that said third entry is replaced by said fourth entry in said dictionary.

10. The machine readable medium of claim 9, wherein said adding adds said fourth entry to said first partition, such that said third entry of said second partition is replaced by said fourth entry in said first partition, wherein no entries are added to said second partition if said two code not assigned are unable to be found.

11. The machine readable medium of claim 10, further comprising increasing the width of said code when said third entry is determined not to exist in said second partition.

12. The machine readable medium of claim 11, wherein said first token is formed as (said string+symbol succeeding said string in said input stream), wherein said second token is formed as (previous token+symbol succeeding said previous token in said input stream), wherein said previous token is said first token formed in processing of a previous string of said input stream, wherein '+' represents a text appending operation.

13. The machine readable medium of claim 12, wherein said sequence of symbols of said input stream are processed iteratively, wherein said emitting, said storing, said forming, said checking and said adding of said first entry and said second entry, are performed in each of a first sequence of iterations, wherein said emitting, said storing, said forming, said checking, said inspecting and said adding of said fourth entry, are performed in each of a second sequence of iterations following said first sequence of iterations.

14. The machine readable medium of claim 13, further comprising one or more instructions for:

identifying by the end of said second sequence of iterations, based on said data, a set of entries in said second partition that are indicated to be not unused in forming said output stream; and merging said set of entries to said first partition by the end of said first sequence of iterations and prior to start of said second sequence of iterations.

15. A digital processing system comprising:

a processor;

a random access memory (RAM);

a machine readable medium to store one or more instructions, which when retrieved into said RAM and executed by said processor causes said digital processing system to perform the actions of:

receiving an input stream containing a sequence of symbols;

identifying a longest string from a present symbol matching a first token in a dictionary, said dictionary containing a plurality of entries, each entry associating a token to a corresponding code, a first entry of said plurality of entries associating said first token to a first code;

emitting the code corresponding to said first token in a corresponding entry, as an output code to an output stream;

adding a second entry and a third entry to said dictionary, wherein said second entry associates (said longest string+symbol succeeding said longest string in said input stream) to a first available code according to said dictionary, wherein said third entry associates (a previous token+symbol succeeding said previous token in said input stream) to a second available code according to said dictionary, wherein said previous token represents the token of said second entry in a previous iteration, wherein '+' represents a text appending operation, wherein said emitting and said adding are performed in response to said identifying of said longest string from said present symbol; and performing a next iteration of said identifying, said emitting and said adding with said present symbol set to the symbol succeeding said longest string in said input stream.

16. The digital processing system of claim 15, wherein said dictionary is initialized to a start set of entries before a first one of said iterations, wherein each of said start set of entries associates one of a set of possible different symbols in said input stream to a corresponding code, wherein the number of entries in said start set of entries equals the number of symbols in said set of possible different symbols.

17. The digital processing system of claim 16, wherein during a first sequence of iterations, said second entry and said third entry of each iteration are respectively stored in a first partition and a second partition of said dictionary, wherein during a second sequence of iterations following said first sequence of iterations, some of said entries of said second partition are replaced by said second entry of each of said second sequence of iterations.

18. The digital processing system of claim 17, further performing the actions of:

maintaining data indicating whether each of said entries in said second partition is unused in said output stream during said first sequence of iterations, wherein said data indicates a first set of entries of said second partition as being unused by the end of said first sequence of iterations, wherein said some of said entries correspond to said first set of entries.

19. The digital processing system of claim 18, further performing the actions of:

merging entries in said second partition other than said first set of entries to said first partition by the end of said first sequence of iterations and prior to start of said second sequence of iterations, wherein the replaced entries in said second sequence of iterations are added to said first partition, wherein no entries are added to said second partition during said second sequence of iterations.

20. The digital processing system of claim 19, wherein an increase in the width of said code increases the number of available codes for entries in said dictionary, wherein said first sequence of iterations are performed with a first width for said code, wherein said second sequence of iterations are also performed with said first width without increasing the width of said code, wherein the width of said code is increased from said first width, only after all of said first set of entries in said second partition are replaced.

* * * * *